United States Patent
Thakur et al.

[11] Patent Number: 5,926,742
[45] Date of Patent: *Jul. 20, 1999

[54] CONTROLLING SEMICONDUCTOR STRUCTURAL WARPAGE IN RAPID THERMAL PROCESSING BY SELECTIVE AND DYNAMIC CONTROL OF A HEATING SOURCE

[75] Inventors: Randhir P. S. Thakur; Annette L. Martin, both of Boise, Id.

[73] Assignee: Micron Technology, Inc., Boise, Id.

[*] Notice: This patent is subject to a terminal disclaimer.

[21] Appl. No.: 08/927,603

[22] Filed: Sep. 12, 1997

Related U.S. Application Data

[63] Continuation of application No. 08/582,728, Jan. 4, 1996, Pat. No. 5,851,929.

[51] Int. Cl.⁶ .................................................. H01L 21/324
[52] U.S. Cl. .......................................................... 438/795
[58] Field of Search .................................. 438/795, 479; 219/388, 405

[56] References Cited

U.S. PATENT DOCUMENTS

| | | | |
|---|---|---|---|
| 4,694,143 | 9/1987 | Nishimura et al. | 219/388 |
| 4,755,654 | 7/1988 | Crowley et al. | 219/405 |
| 4,818,327 | 4/1989 | Davis et al. | |
| 4,888,302 | 12/1989 | Ramesh | 117/44 |
| 5,155,336 | 10/1992 | Gronet et al. | |
| 5,155,337 | 10/1992 | Sorrell et al. | |
| 5,382,551 | 1/1995 | Thakur et al. | |
| 5,418,885 | 5/1995 | Hauser et al. | |
| 5,444,815 | 8/1995 | Lee et al. | |
| 5,490,728 | 2/1996 | Schietinger et al. | 374/7 |

OTHER PUBLICATIONS

Wolf et al. "Silicon Processing for the VLSI Era vol. 1–Process Technology" pp. 54–58. Lattice Press, Sunset Beach CA USA, 1986.

*Primary Examiner*—Charles Bowers
*Assistant Examiner*—Craig Thompson
*Attorney, Agent, or Firm*—Reed, Smith, Shaw & McClay LLP

[57] ABSTRACT

A method for correcting the shape of a semiconductor structure. According to the method the shape of a semiconductor structure is initially determined to discern the presence, location and magnitude of structural deformities including warp and bow. Information derived from the topography of the structure is then used to control a heating apparatus. More particularly, individual zones or elements of a multiple zone heating assembly are selectively controlled to direct heat radiation of nonuniform intensities toward different regions of the structure to effect non-isothermal conditions within the structure and thereby reduce deformities that were determined to be present in the structure prior to shape correction.

6 Claims, 4 Drawing Sheets

CONTROLLING SEMICONDUCTOR STRUCTURAL WARPAGE IN RAPID THERMAL PROCESSING BY SELECTIVE AND DYNAMIC CONTROL OF A HEATING SOURCE

This application is a continuation of application Ser. No. 08/582,728, filed on Jan. 4, 1996 now U.S. Pat. No. 5,851,929.

FIELD OF THE INVENTION

The present invention relates in general to fabrication of semiconductors and, more particularly, to a method for correcting the shape of semiconductor structures.

BACKGROUND OF THE INVENTION

Single wafer rapid thermal processing ("RTP") is becoming a preferred technique in fabricating sub-half micron memory devices. This is primarily because RTP enables wafers to be heated rapidly at high temperatures using a controlled heating source. Nonetheless, high temperature processing methods for large diameter semiconductor wafers, such as RTP for example, as well as methods employing a furnace through a complete CMOS flow, have not eliminated the issue of thermal stress. Also, furnace annealing of wafers with high oxygen precipitation may substantially warp and/or bow during subsequent patterning and multi-step processing.

Transient heating techniques, such as laser annealing and RTP, are essentially non-equilibrium processes. In that light, large diameter silicon wafers typically warp and bow as a result of being subjected to high temperature or high stress films. This phenomenon is founded on the nonuniform coefficients of thermal expansion of the various materials which make up the wafer. Uniformly exposed to a high temperature, the wafer's edge reaches a substantially different temperature from the center of the wafer and different regions of the edge may acquire relatively different temperatures among themselves. These differences in temperature between the center of the wafer and its edges create a thermal stress over the wafer. At high temperature, this induced stress results in plastic deformation of the wafer, particularly where it exceeds the elastic limit of the silicon wafer itself.

As a by-product of thermal stress, high stress film deposition and patterning, a wafer will warp and bow where its elastic limit has been surpassed. A semiconductor substrate can deform, by means of warping and bowing, in a variety of ways.

The phenomenon of warp and bow typically results in the dislocation, slippage and gross mechanical instability of the wafer. These side effects of thermal stress can ultimately lead to reduction in device yield, dielectric defects, as well as reduced photolithographic yield. The reduced photolithographic yield is in part attributable to the degradation of wafer uniformity and flatness. Moreover, the loss of geometrical planarity of a wafer due to warp and bow substantially impacts the feasibility of processing a wafer, or leads to self-fracture of the wafer.

Both intrinsic and extrinsic stresses of the wafer, localized in a specific area or uniformly spread across its topography, impact on the flatness of the wafer. The wafer level distortion, in the form of a curve or pattern movement, translates into more stringent critical dimensions and overlay requirements at the lithography step level.

The phenomena of wafer warp and bow is further magnified in high density, sub-half micron devices because of their reliance on multilayer heterostructure formations. Each layer in these devices is typically associated with a different thermal expansion coefficient. Further, several masking steps are required to fabricate each layer, thus compounding component misalignment problems in the event of warp and/or bow type deformities. Thus, steady state exposure to high temperatures over a long period of time due to the effects of thermal stress encourages excessive warp and bow and loss of geometric planarity. Indeed, if the deformation is substantial, any further process venture may even break the wafer.

Representative examples of RTP apparatus may be found in U.S. Pat. Nos. 4,818,327, 5,155,336, 5,155,337, 5,418,885 and 5,444,815. Each disclose RTP apparatus including an RTP chamber having a lamp assembly comprised of a plurality of heating lamps. In U.S. Pat. Nos. 4,818,327 and 5,155,337 the plurality of heating lamps are simultaneously controlled, whereas in the other patents the several lamps are individually controlled. A theme common to each of these patent disclosures is the intent to maintain a semiconductor wafer at a uniform temperature during processing to promote objects such as uniform layer deposition, patterning and the like. It is even suggested in U.S. Pat. Nos. 4,818,327 and 5,155,336 that obtaining temperature uniformity in the substrate during temperature cycling of the substrate is necessary to prevent thermal stress-induced damage such as warpage.

Yet, regardless of how sophisticated past attempts at maintaining a semiconductor structure at a uniform temperature during RTP to minimize warpage may have been, none have proven completely successful. Consequently, the very act of RTP treatment of a substrate imparts some unavoidable measure of deformation to the substrate. Further, as mentioned above, such deformation may be exacerbated by other localized or generalized intrinsic and extrinsic stresses acting upon the wafer.

U.S. Pat. No. 5,382,551 has proposed an effective method to reduce the effects of semiconductor structural deformities. That technique involves depositing at least one layer superjacent and at least one layer subjacent a semiconductor substrate. The substrate may be deformed, such as by warp, bow, or both, either inherently or as a result of the layers deposited thereabove and therebelow. The layers may be deposited using any conventional processes known to those skilled in the art. For example, the layers may be deposited by at least one of Low Pressure Chemical Vapor Deposition ("LPCVD"), Plasma Deposition, and Rapid Thermal Processing Chemical Vapor Deposition ("RTPCVD"), or by other means known in the art.

The deformed substrate is then examined for warp and bow, and the warp and bow of the deformed substrate is compared with a reference. Thereafter, the thickness of at least one of the superjacent and subjacent layers is reduced, or at least one of the subjacent layer(s) is removed (possibly in combination with reducing the thickness of the superjacent layer) to reduce the deformity until the wafer planarity corresponds substantially to that of the reference.

Although this method is a reliable means by which to achieve wafer planarity, it contributes additional layer reduction/removal steps to the semiconductor device fabrication process and may detrimentally affect the superjacent or circuit bearing side of the wafer. Moreover, removal of material from the wafer also increases the possibility of contamination effects that may result in wafer rejection, thereby reducing throughput productivity.

A need exists, therefore, for an uncomplicated semiconductor shape correction method which utilizes a minimum of procedural steps to minimize semiconductor structural deformities.

SUMMARY OF THE INVENTION

It is the primary object of the present invention to eliminate the aforementioned drawbacks of the prior art.

Another object of the present invention is to provide a method for fabricating semiconductors which reduces the effects of semiconductor structural deformities.

It is further object of the present invention to provide a method for fabricating semiconductors which overcomes the effects of warp and bow in the manufacture of semiconductor devices.

In order to achieve these and other objects which will become apparent hereinafter, a method is disclosed for reducing the effects of semiconductor structural deformities.

RTP typically involves deployment of an inductive heating system comprising a chamber having at least one heating source and one or more reflectors. The heating source(s) use radiant energy which is concentrated by the reflectors to heat the semiconductor structure. Suitable heating sources include, although are not limited to, tungsten-halogen lamps and graphite heaters.

RTP and other transient heating methods enable comparatively rapid "ramp up," "steady state" and "ramp down" cycling. For instance, ramp up and ramp down rates may range from about 2° C./min to about 200° C./sec and steady state treatment temperatures generally range from about 700 to about 1250° C. In accordance with these techniques, intense radiation quickly brings the semiconductor structure and any growth, deposition or other treatment gas that may be present adjacent the structure's surface up to an optimal treatment temperature, usually in a matter of seconds. This treatment temperature is maintained for as long as needed (typically several seconds) whereupon the radiation is deactivated and the structure cools in a matter of seconds. Because of the brief heating/cooling time cycles it provides, transient heating permits accurate control of the semiconductor fabrication procedures in which it may be used, e.g., deposition, growth, doping, patterning, annealing and other sequences, while conserving the thermal budget of the fabrication process.

The very characteristics which make RTP and related rapid heating systems attractive methods by which to manufacture semiconductor devices also can contribute to undesirable structural deformation of the devices. For example, RTP systems include chamber, lamp and reflector configurations designed to produce intense radiation and rapid ramp rates. Combining these effects with the incoming reactant gases and the intricate patterned structures formed on the semiconductor substrates may result in considerable intrinsic and extrinsic wafer stresses. These stresses, in turn, may manifest themselves as localized or generalized deformities in the wafer's topography.

The transient nature of RTP and similar heating sources and the faster ramp rates they afford increase the potentiality for wafer deformation in high density devices having a stack of heterostructures formed thereon. Such devices comprise a complex stacked array of materials each of which has a specific emissivity, coefficient of thermal expansion and capacity to absorb and conduct heat. Consequently, even the most sophisticated heating equipment applying various radiation intensities over different regions of the wafer does not translate into uniform temperature being achieved internally of the wafer. Hence, semiconductor structural deformities including warp and bow and the like are virtually unavoidable.

The present invention overcomes the deficiencies of existing transient heating systems via a novel method in which high intensity heat radiation is used as a means to control and correct warpage and related deformation arising from semiconductor fabrication processes. Generally, the instant invention proposes to apply heat radiation of nonuniform intensities to different regions of a semiconductor structure to effect non-isothermal conditions within the structure and thereby reduce deformities in the shape of the structure. More particularly, prior to a heating step, the shape of the wafer is determined using suitable measuring equipment to discern whether and to what extent deformities may be present in the wafer's topography. Information relating to the determined wafer shape is then used to control the heating operation. In this regard, the radiation emitting elements or zones of the heating apparatus may be individually operated responsive to the derived wafer shape information to emit radiation of non-uniform intensities whereby non-isothermal conditions may be created in the wafer to compensate for the identified deformities. In so doing, the severity of the deformities is reduced and the overall shape of the wafer is adjusted until it assumes a substantially planer configuration. The heating apparatus, which may assume the form of an RTP apparatus or similar transient heating device, may provide top-side heating, bottom-side heating, peripheral heating or any combination of these consistent with the specific operational capabilities of the apparatus.

Other details, objects and advantages of the present invention will become apparent as the following description of the presently preferred embodiments and presently preferred methods of practicing the invention proceeds.

BRIEF DESCRIPTION OF THE DRAWINGS

The invention will become more readily apparent from the following description of preferred embodiments thereof shown, by way of example only, in the accompanying drawings wherein.

DETAILED DESCRIPTION OF THE INVENTION

Figure 1A:
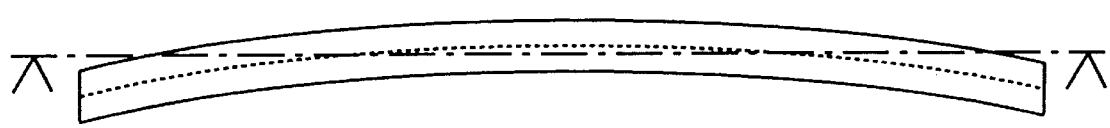
FIGS. 1A and 1B are cross-sectional stylized views of a warped semiconductor structure.
Figure 1B:
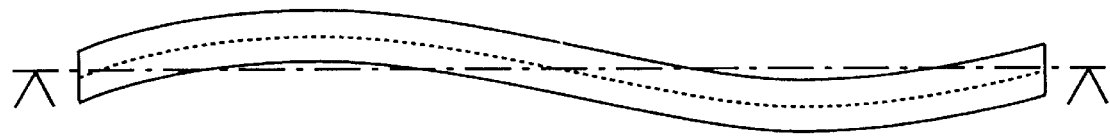
Figure 2:
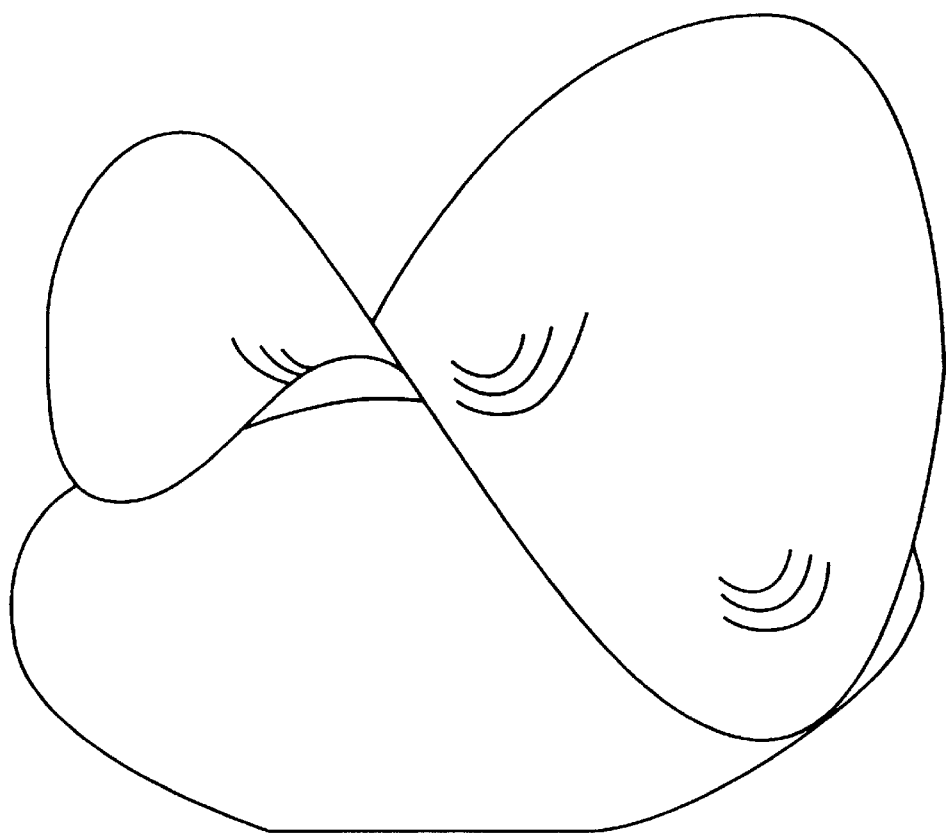
FIG. 2 is a exaggerated three dimensional view of a warped semiconductor structure.

FIGS. 1A and 1B illustrate in cross-section two of the many different configurations a deformed semiconductor structure may assume as a consequence of thermal stress, high stress film deposition, patterning, doping, annealing and other treatments associated with fabrication of a semiconductor device. Similarly, FIG. 2 shows a three dimensional and somewhat exaggerated perspective view of a typical profile of warpage a semiconductor structure might assume when subjected to the aforesaid treatments. For present purposes, the term "semiconductor structure" shall be construed to include not only the silicon substrate or wafer itself but also such element in combination with the one or more superjacent and/or subjacent heterostructural layers that may be formed thereon. Moreover, the semiconductor substrate preferably comprises single crystal, polycrystalline, or amorphous silicon, though any other suitable material known in the art can also be employed. Likewise, the chemical compositions of any superjacent and/or subjacent layers that may be carried by the substrate may be selected from a variety of materials relevant to fabricating semiconductor devices, such as silicon dioxide, silicon nitride, tungsten or any other material known to one of ordinary skill in the art.

Figure 3:
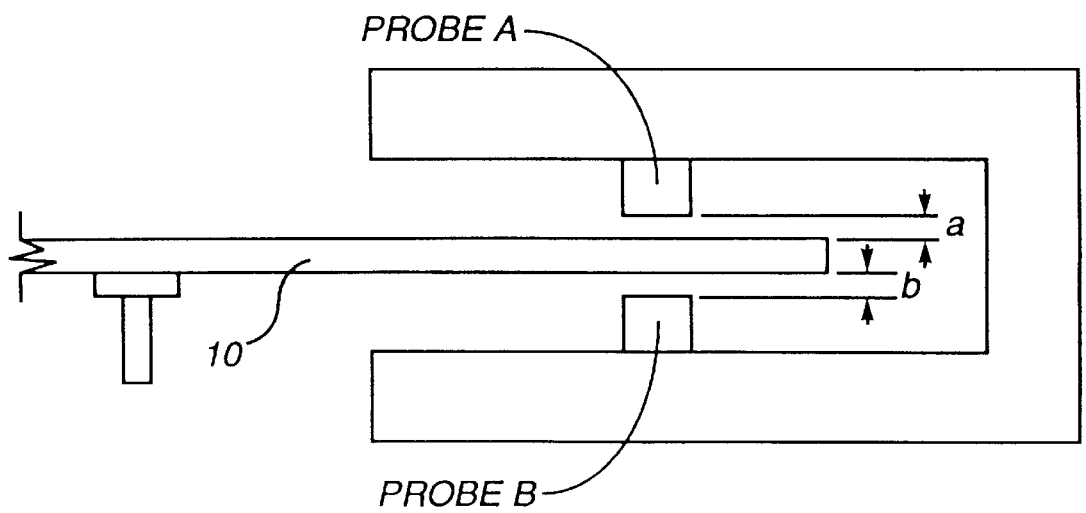
FIG. 3 is a system for measuring the warp and bow of a semiconductor structure.

Any conventional device or system capable of accurate measurement of the warp and bow of a semiconductor structure may be used to realize the advantages of the shape correction method of the present invention. By way of example, FIG. 3 depicts such a system as described in U.S. Pat. No. 5,382,551, the disclosure of which is incorporated herein by reference. The system employs two probes, Probe A and Probe B, for measuring the warpage of a semiconductor structure 10. The geometry of a typical wafer structure 10 may be rectangular or other polygonal shape. More commonly, however, structure 10 is substantially circular in shape having a diameter of at least about 2 inches and, more preferably, from about 8 to about 18 inches. Probe A is positioned in association with the top portion of structure 10, while Probe B is positioned in association with the bottom portion of the structure. Using the system of FIG. 3, the warp and bow of a semiconductor structure can be mathematically deduced. Bow can be expressed by the following equation:

$$Bow=(½)*(Peak-Base).$$

Warp can be defined by the following formula:

$$Warp=(½)*[(b-a)_{max}-(b-a)_{min}]$$

where a=distance between Probe A and the structure's top surface;

b=distance between Probe B and the structure's bottom surface;

max=maximum difference between "b" and "a" over the structure; and min=minimum difference between "b" and "a" over the structure.

Having determined its unique warp and bow characteristics, structure 10 may then be treated by a suitable transient heating apparatus for shape correction. The shape correction process may be performed solely for its own benefit. In the more typical case, however, it is contemplated that shape correction be executed in conjunction with, and usually immediately after, other wafer treatments typically performed in a transient heating device such as film deposition or growth, doping, patterning, annealing and the like. Any transient heating apparatus having individually controllable heating zones or elements and capable of rapid ramp up, steady state and ramp down operation may be used to perform the shape correction method according to the present invention. As presently contemplated, however, the invention may be effectively practiced using a suitably equipped RTP apparatus, and the following description relates how such an apparatus may be operated to perform semiconductor shape correction. By way of example, an RTP apparatus capable of achieving the objectives of the present invention is described in U.S. Pat. No. 5,155,336, the disclosure of which is incorporated by reference. The essential characteristics of that apparatus are discussed in connection with FIG. 4.

Figure 4:
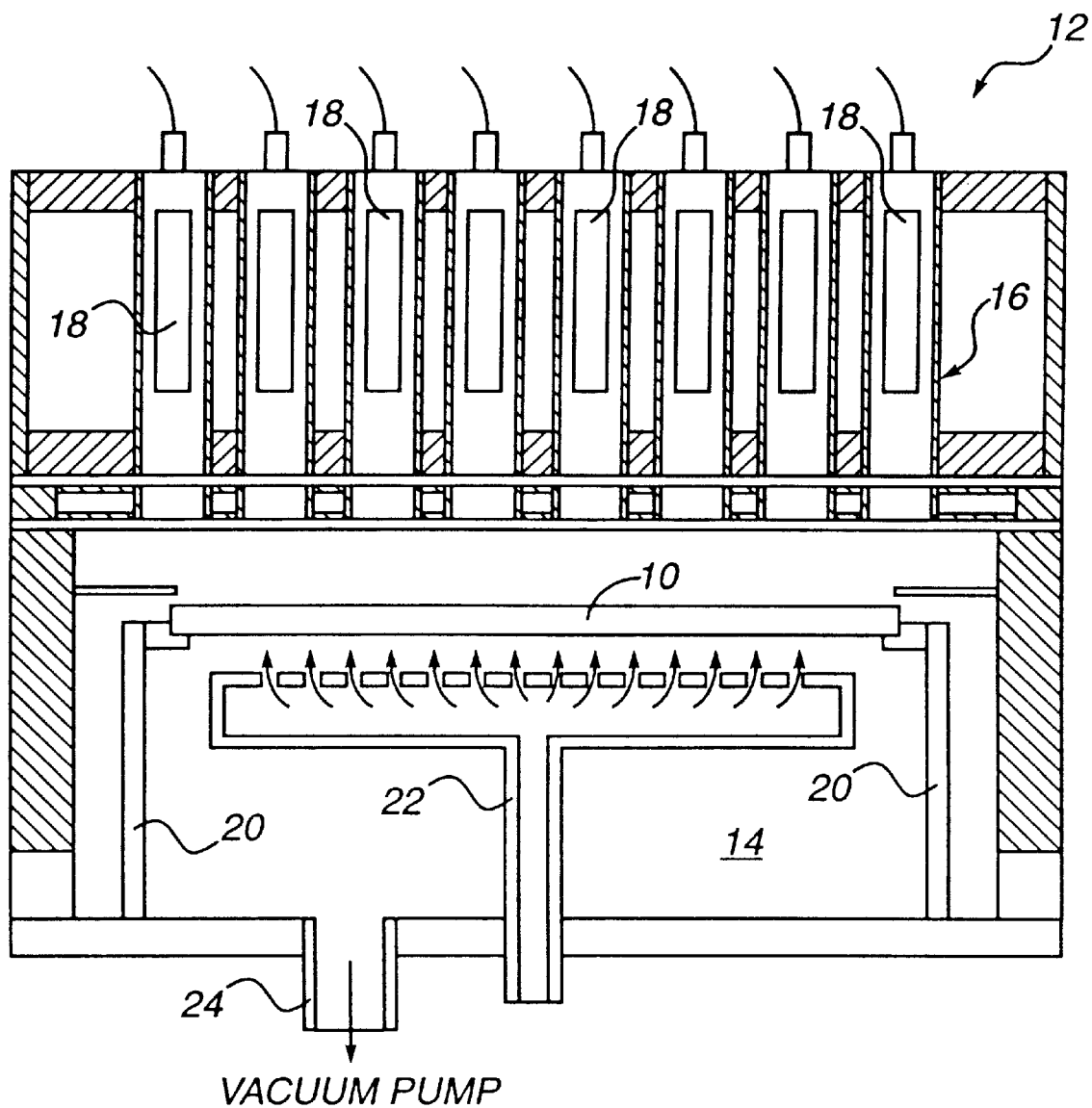
FIG. 4 is a side elevation view, in partial section, of an RTP chamber suitable for practicing the method of the present invention.
Figure 5:
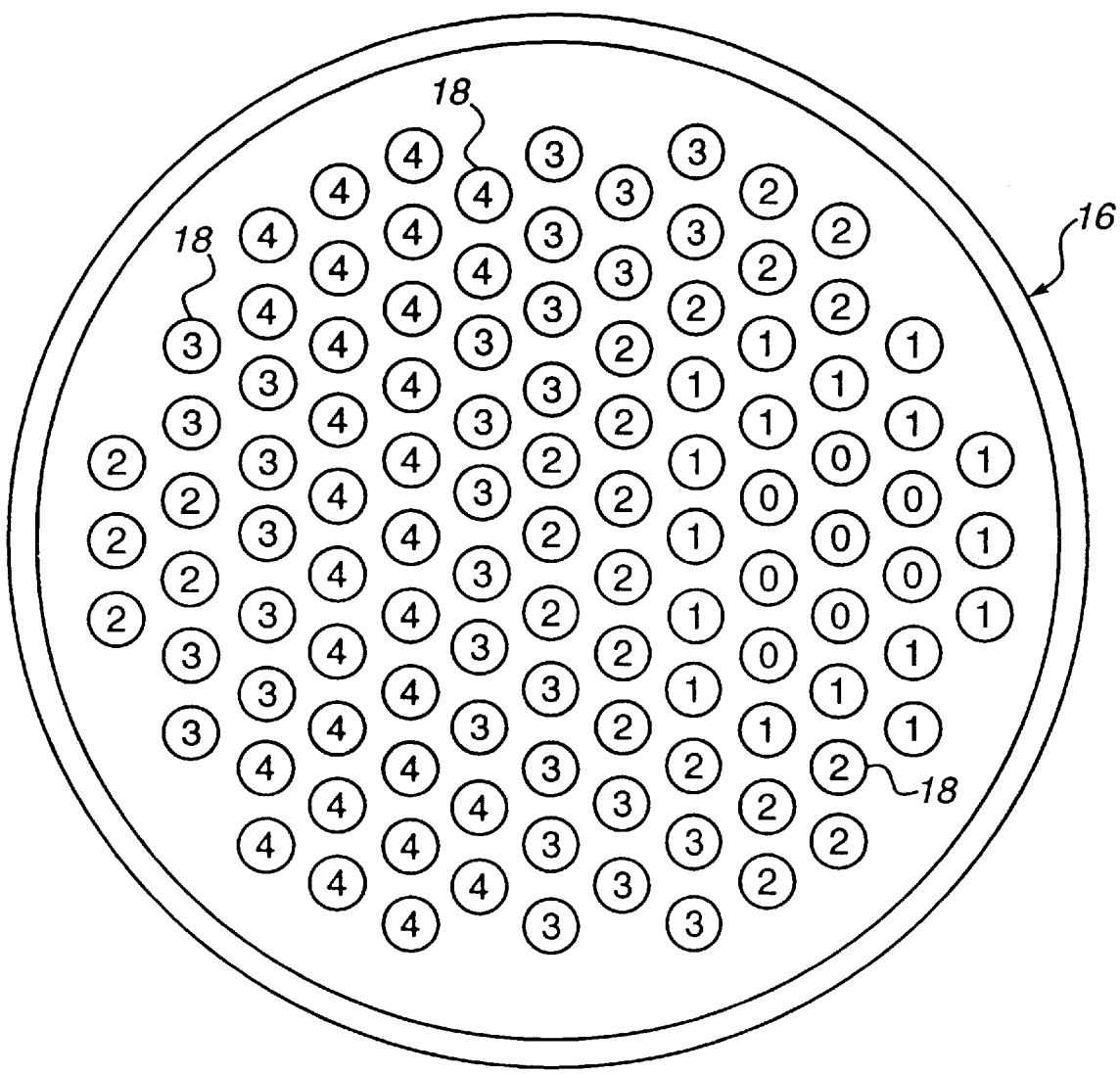
FIG. 5 is a view of a pattern of radiation intensities generated by the lamp assembly of the RTP chamber of FIG. 4 suitable for correcting the shape of a typically warped semiconductor structure.

As depicted in FIG. 4, the RTP apparatus, identified by reference numeral 12, includes an RTP chamber 14 above which is located a lamp assembly 16 comprised of a plurality of lamps 18, e.g., tungsten-halogen lamps, arranged in a prescribed array. As shown in FIG. 5 to be discussed hereinafter, a typical lamp array is generally circular in shape to most efficiently accommodate the substantially circular semiconductor structure wafers which are processed individually within chamber 14.

When received within the RTP chamber 14, the semiconductor structure 10 is supported at its edges by upright supports 20. Chamber 14 also normally comprises a gas injection head 22 for injecting gases into the chamber whereby various processing steps may be performed therein. The chamber is also usually provided with an exhaust means 24 which is typically connected to a vacuum pump for partially or completely evacuating the chamber as may be needed for particular RTP procedures. RTP apparatus 12 further comprises a plurality of variable output power supplies (not illustrated), each being adapted to provide power to one of the lamps 18 of lamp assembly 16. RTP apparatus 12 may also include reflector means for strategically focussing the radiation generated by lamps 18. Preferably the RTP apparatus additionally comprises a microprocessor adapted to control the various operational systems of the apparatus. Such microprocessor should, at minimum, be capable of controlling the individual lamp power supplies. In that way, the intensity of the heat radiation generated by each lamp 18 can be selectively varied to achieve the desired functions of the RTP apparatus, including the semiconductor structure shape correction function according to the present invention.

FIG. 5 symbolically depicts through numerical designations 0 through 4 a typical pattern of radiation intensities that may be generated by selective control of the individual lamps 18 of the lamp assembly 16 of RTP apparatus 12. For purposes of the present discussion, the number 0 corresponds to a deactivated lamp generating no radiation; 1 corresponds to a lamp operating at 25% power; 2 corresponds to a lamp operating at 50% power; 3 corresponds to a lamp operating at 75% power; and 4 corresponds to a lamp operating at full power and thereby producing maximum (100%) radiation intensity. It will be understood, however, that the power supplied to and the corresponding radiation output of each of the lamps 18 are preferably capable of substantially infinite adjustment between 0 and 100% whereby intricate and myriad patterns of radiation intensity may be generated by the lamp assembly 16.

The method for correcting the shape of a deformed semiconductor structure according to the present invention may be briefly described as follows.

Initially the semiconductor structure 10 is placed into the RTP chamber 14. The lamp assembly 16 is then operated, as is known in the art, such that its individual lamps 18 are activated to generate preselected and, typically, varied radiation intensities. The greatest radiation intensities are normally directed at the semiconductor structure's edge regions which generally dissipate heat more rapidly than the center of the structure. Such variable intensity radiation heating thus substantially, although not completely, equalizes the temperature throughout the body of structure 10 which contributes to uniform layer deposition and growth, doping, patterning, annealing and other semiconductor fabrication procedures. Stated differently, the semiconductor structure is desirably exposed to nonuniform levels of heat radiation so as to effect substantially isothermal conditions within the structure that are necessary to promote substantially uniform processing of the structure. Concurrently with the application of nonuniform heat intensities, the structure may be processed, e.g., by the growth or deposition of a desired chemical layer, doping, patterning, and the like.

Following this, the structure's shape, including bow and warpage components, is determined using an appropriate shape measuring system, e.g., that described above in connection with FIG. 3. Data corresponding to the determined shape is then manually or, more preferably, automatically fed to the microprocessor. Responsive to receipt of the data corresponding to the determined shape, the microprocessor, in cooperation with appropriate software, then operates to control the RTP lamp assembly 16 whereby the individual lamps 18 thereof are activated to generate nonuniform levels of radiation intensity to be directed at different regions of the structure. Accordingly, the semiconductor structure 10 is differentially heated to effect non-isothermal conditions within the structure which compensate for, and therefore correct, the deformities that were determined to be present in the structure. In contrast to doping, deposition, growth, patterning, annealing and other procedures, when subjected to shape correction heating pursuant to the present invention, the semiconductor structure is exposed to nonuniform levels of heat radiation to effect a nonuniform temperature throughout the body of the structure whereby intrinsic and extrinsic stresses are relieved, deformities are reduced and the structure becomes substantially flattened.

The dynamic control of the lamp assembly in the context of shape correction is preferably maintained throughout the ramp up, steady state and ramp down phases of heating. And, the selective heating may be applied to compensate for mildly as well as severely deformed structures, i.e., structures that may require certain regions of the structure to be exposed to maximum radiation whereas other portions may be exposed to zero radiation or any radiation level therebetween.

It is also contemplated that the above-described semiconductor structure shape correction method may be practiced by itself rather than in conjunction with other fabrication processes when only shape correction is desired or necessary. Further, the determination of the shape of the semiconductor structure need not be performed on a structure-by-structure basis immediately preceding the shape correction procedure. That is, the shape of a warped semiconductor structure subjected to certain heating conditions and bearing certain heterostructural layer configurations may be determined only once. Thereafter, substantially identically treated and constructed semiconductor structures, even if their shapes are not individually and directly measured, may have precise shape correction performed pursuant to the present invention using the heating protocol determined to be appropriate for the originally measured warped structure.

As previously mentioned, any suitably equipped RTP apparatus or similar transient heating device may be used to perform the semiconductor shape correction method according to the present invention. Accordingly, although described in connection with an apparatus capable of providing top side heating of a semiconductor structure, the structure may be heated instead on its bottom side, about its peripheral edge or may be exposed to any combination of top-side, bottom-side and peripheral heating depending upon the particular heating capabilities of the selected heating apparatus.

Although the invention has been described in detail for the purpose of illustration, it is to be understood that such detail is solely for that purpose and that variations can be made therein by those skilled in the art without departing from the spirit and scope of the invention except as it may be limited by the claims.

What is claimed is:

1. A method of correcting the shape of a semiconductor structure, said method comprising applying heat radiation of nonuniform intensities to different regions of a semiconductor structure to effect non-isothermal conditions within said structure to thereby reduce deformities in the shape of said structure.

2. The method of claim 1 further comprising performing said method in a heating apparatus having a plurality of individually controllable heating zones.

3. The method of claim 2 wherein said heating apparatus comprises a rapid thermal processing apparatus.

4. The method of claim 3 wherein said rapid thermal processing apparatus comprises a lamp assembly including a plurality of selectively controllable lamps, and wherein said method further comprises selectively controlling said lamps to apply said heat radiation of nonuniform intensities.

5. The method of claim 1 further comprising determining the shape of said structure prior to applying said heat radiation, and applying said heat radiation responsive to the determined shape of said structure.

6. The method of claim 1 wherein said heat radiation of nonuniform intensities is applied to at least one of a top side, a bottom side and a periphery of said structure.

* * * * *